US006674386B2

(12) United States Patent
Carreau et al.

(10) Patent No.: US 6,674,386 B2
(45) Date of Patent: Jan. 6, 2004

(54) DUAL CHANNEL ANALOG TO DIGITAL CONVERTER

(75) Inventors: Gary R. Carreau, Plaistow, NH (US); Bruce E. Amazeen, Ipswich, MA (US); Michael C. W. Coln, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 19 days.

(21) Appl. No.: 10/142,500

(22) Filed: May 10, 2002

(65) Prior Publication Data

US 2003/0210165 A1 Nov. 13, 2003

(51) Int. Cl.[7] .............................................. H03M 1/12
(52) U.S. Cl. ....................................... 341/155; 341/163
(58) Field of Search ................................ 341/144, 155, 341/172, 163

(56) References Cited

U.S. PATENT DOCUMENTS

| | | | | |
|---|---|---|---|---|
| 4,574,250 A | * | 3/1986 | Senderowicz | 330/258 |
| 4,633,223 A | * | 12/1986 | Senderowicz | 341/118 |
| 4,940,981 A | * | 7/1990 | Naylor et al. | 341/161 |
| 5,684,487 A | * | 11/1997 | Timko | 341/172 |
| 5,724,000 A | * | 3/1998 | Quinn | 327/554 |
| 5,739,720 A | * | 4/1998 | Lee | 330/9 |
| 5,959,469 A | * | 9/1999 | Kurauchi et al. | 327/77 |

* cited by examiner

*Primary Examiner*—Peguy JeanPierre
(74) *Attorney, Agent, or Firm*—Bromberg & Sunstein LLP

(57) ABSTRACT

A dual channel ADC uses two digital to analog converters (DACs) and a single comparator to convert two analog input channels. One DAC is used for successive approximation, while the other DAC is used for calibration. The dual channel ADC allows for sampling and conversion of single-ended, pseudo-differential, and fully differential analog input signals while maintaining layout symmetry and reducing crosstalk without substantially increasing circuit area. The single comparator is used for converting both analog input channels. Additional logic (such as switches or digital logic) is used to connect the input sampling capacitors and DACs to the appropriate inputs of the comparator for converting the analog input channels.

23 Claims, 9 Drawing Sheets

DUAL CHANNEL ANALOG TO DIGITAL CONVERTER

FIELD OF THE INVENTION

The present invention relates generally to analog to digital converters, and more particularly to a simultaneous sampling analog to digital converter.

BACKGROUND OF THE INVENTION

An analog to digital converter (ADC) converts an analog signal into a digital representation of the analog signal. The ADC typically samples the analog signal at periodic intervals and generates a digital value for each sample indicating the approximate magnitude of the sampled analog signal.

A single-ended (single input) ADC measures the analog signal with respect to a ground signal that is common to both the analog signal and the converter.

A pseudo-differential ADC measures the analog signal with respect to a fixed signal return that can be different than the converter return (ground).

A differential ADC measures the difference between two signals that move in opposite directions with respect to a common mode voltage.

One type of ADC uses a technique known as successive approximation (SAR) to convert each analog input sample to a digital value. Such an ADC typically includes a digital to analog converter (DAC) and a single comparator to produce a digital value representing the magnitude of the analog input sample. The DAC is used to produce a reference voltage based upon a digital input value. The comparator is used to compare the DAC output to the analog input sample. The ADC converts an analog input sample to a digital value by successively changing the DAC output and comparing the DAC output to the analog input sample. The ADC effectively makes a bisection or binomial search beginning with a DAC output of zero. The ADC provisionally sets each bit of the DAC, beginning with the most significant bit, and then uses the comparator to compare the DAC output to the analog input signal being measured. If setting a bit to one causes the DAC output to rise above the analog input signal voltage, that bit is returned to zero.

It is sometimes necessary or desirable to sample two analog signals simultaneously. This can be useful, for example, for maintaining the relative phase information of the two analog signals.

SUMMARY OF THE INVENTION

In accordance with one aspect of the invention, a dual channel ADC uses two DACs and a single comparator to convert two analog input channels. One DAC (the SarDAC) is used for successive approximation, while the other DAC (the CalDAC) is used for calibrating the SarDAC. The dual channel ADC allows for sampling and conversion of single-ended, pseudo-differential, and fully differential analog input signals while maintaining layout symmetry and reducing crosstalk without substantially increasing circuit area. The single comparator is used for converting both analog input channels. Additional logic (such as switches or digital logic) is used to connect the input sampling capacitors and DACs to the appropriate inputs of the comparator for converting the analog input channels.

In a typical embodiment, a first sampling capacitor is used to sample a first analog input signal and a second sampling capacitor is used to sample a second analog input signal. In order to convert the first analog input signal sample, the first sampling capacitor and the SarDAC are connected to a first comparator input while the CalDAC is connected to a second comparator input. In order to convert the second analog input signal sample, the second sampling capacitor and the SarDAC are connected to the second comparator input while the CalDAC is connected to the first comparator input.

A separate capacitor may be used on each channel to sample a corresponding ground reference signal or differential input signal. The capacitor corresponding to the first sampling capacitor is connected to the second comparator input along with the CalDAC during conversion of the first analog input signal sample. The capacitor corresponding to the second sampling capacitor is connect to the first comparator input along with the CalDAC during conversion of the second analog input signal sample.

Various switches are typically used to connect each of the capacitors to the appropriate comparator input.

Additional switches may also be used to connect each DAC to the appropriate comparator input. Alternatively, digital logic can be used to convert the analog input signal samples without such switches.

An exemplary dual channel analog to digital converter typically includes a first sampling capacitor for sampling a first analog input signal, a second sampling capacitor for sampling a second analog input signal, a first digital to analog converter for successive approximation of the first analog input signal and the second analog input signal, a second digital to analog converter for calibrating the first digital to analog converter, a comparator having a first comparator input and a second comparator input, input sampling logic operably coupled to cause the first sampling capacitor to sample the first analog input signal and to cause the second sampling capacitor to sample the second analog input signal, and conversion logic operably coupled to connect the first sampling capacitor and the first digital to analog converter to the first comparator input and connect the second digital to analog converter to the second comparator input for converting a first analog input signal sample and to connect the second sampling capacitor and the first digital to analog converter to the second comparator input and connect the second digital to analog converter to the first comparator input for converting a second analog input signal sample.

The input sampling logic typically includes a first sampling switch operably coupled to selectively connect the first sampling capacitor to a first reference voltage for sampling the first analog input signal and a second sampling switch operably coupled to selectively connect the second sampling capacitor to a second reference voltage for sampling the second analog input signal.

The conversion logic typically includes a switch having a first position connecting the first sampling capacitor to the first comparator input for converting the first analog input signal sample and a second position disconnecting the first sampling capacitor from the first comparator input and a switch having a first position connecting the second sampling capacitor to the second comparator input for converting the second analog input signal sample and a second position disconnecting the second sampling capacitor from the second comparator input.

The conversion logic may also include a cross-connect switch operably coupled to connect the first digital to analog converter to the first comparator input and the second digital to analog converter to the second comparator input for converting the first analog input signal sample and to connect the first digital to analog converter to the second comparator input and the second digital to analog converter to the first comparator input for converting the second analog input signal sample. The cross-connect switch typically includes a switch having a first position connecting the first digital to analog converter to the first comparator input for converting the first analog input signal sample and a second position disconnecting the first digital to analog converter from the first comparator input, a switch having a first position connecting the second digital to analog converter to the second comparator input for converting the first analog input signal sample and a second position disconnecting the second digital to analog converter from the second comparator input, a switch having a first position connecting the first digital to analog converter to the second comparator input for converting the second analog input signal sample and a second position disconnecting the first digital to analog converter from the second comparator input, and a switch having a first position connecting the second digital to analog converter to the first comparator input for converting the second analog input signal sample and a second position disconnecting the second digital to analog converter from the first comparator input.

Alternatively, the conversion logic may include digital logic operably coupled to connect the first digital to analog converter to the first comparator input and the second digital to analog converter to the second comparator input for converting the first analog input signal sample and to connect the first digital to analog converter to the second comparator input and the second digital to analog converter to the first comparator input for converting the second analog input signal sample.

The dual channel analog to digital converter may also include a third sampling capacitor for sampling a third analog input signal and a fourth sampling capacitor for sampling a fourth analog input signal. The third and fourth analog input signals may be ground reference signals corresponding to the first and second analog input signals, respectively. The third and fourth analog input signals may be components of fully-differential analog input signals corresponding to the first and second analog input signals, respectively.

In any case, the input sampling logic typically includes a third sampling switch operably coupled to selectively connect the third sampling capacitor to a third reference voltage for sampling the third analog input signal and a fourth sampling switch operably coupled to selectively connect the fourth sampling capacitor to a fourth reference voltage for sampling the fourth analog input signal. The conversion logic is operably coupled to connect the third sampling capacitor to the second comparator input for converting the first analog input signal sample and to connect the fourth sampling capacitor to the first comparator input for converting the second analog input signal sample. The conversion logic typically includes a switch having a first position connecting the third sampling capacitor to the second comparator input for converting the first analog input signal sample and a second position disconnecting the third sampling capacitor from the second comparator input and a switch having a first position connecting the fourth sampling capacitor to the first comparator input for converting the second analog input signal sample and a second position disconnecting the fourth sampling capacitor from the first comparator input.

The input sampling logic may provide for simultaneously sampling the first analog input signal and the second analog input signal. Alternatively, the input sampling logic may provide for sampling the second analog input signal during conversion of the first analog input signal sample and sampling the first analog input signal during conversion of the second analog input signal sample.

In a typical embodiment, the various components are configured in a substantially symmetric layout.

In a typical embodiment, the first sampling capacitor is formed from a first number of unit capacitors surrounded by a first number of dummy capacitors, and the second sampling capacitor is formed from a second number of unit capacitors surrounded by a second number of dummy capacitors. The additional capacitors used for ground reference sampling or fully-differential sampling are typically formed from the dummy capacitors.

In order to reduce crosstalk between the inputs due to the finite routing and bonding impedances within the package, the various capacitors may be sampled with reference to separate common mode voltages rather than to a common voltage.

The conversion logic can first convert the first analog input signal sample and then convert the second analog input signal sample. Alternatively, the conversion logic can first convert the second analog input signal sample and then convert the first analog input signal sample.

DETAILED DESCRIPTION OF A PREFERRED EMBODIMENT

In an embodiment of the present invention, a dual channel ADC uses two DACs and a single comparator to convert two analog input channels (referred to herein as analog input signal A and analog input signal B, respectively). The dual channel ADC allows for sampling and conversion of single-ended, pseudo-differential, and fully differential analog input signals while maintaining layout symmetry and reducing crosstalk without substantially increasing circuit area. The single comparator is used for converting both analog input channels. Additional logic (such as switches or digital logic) is used to connect the input sampling capacitors and DACs to the appropriate inputs of the comparator for converting the analog input channels.

Figure 1:
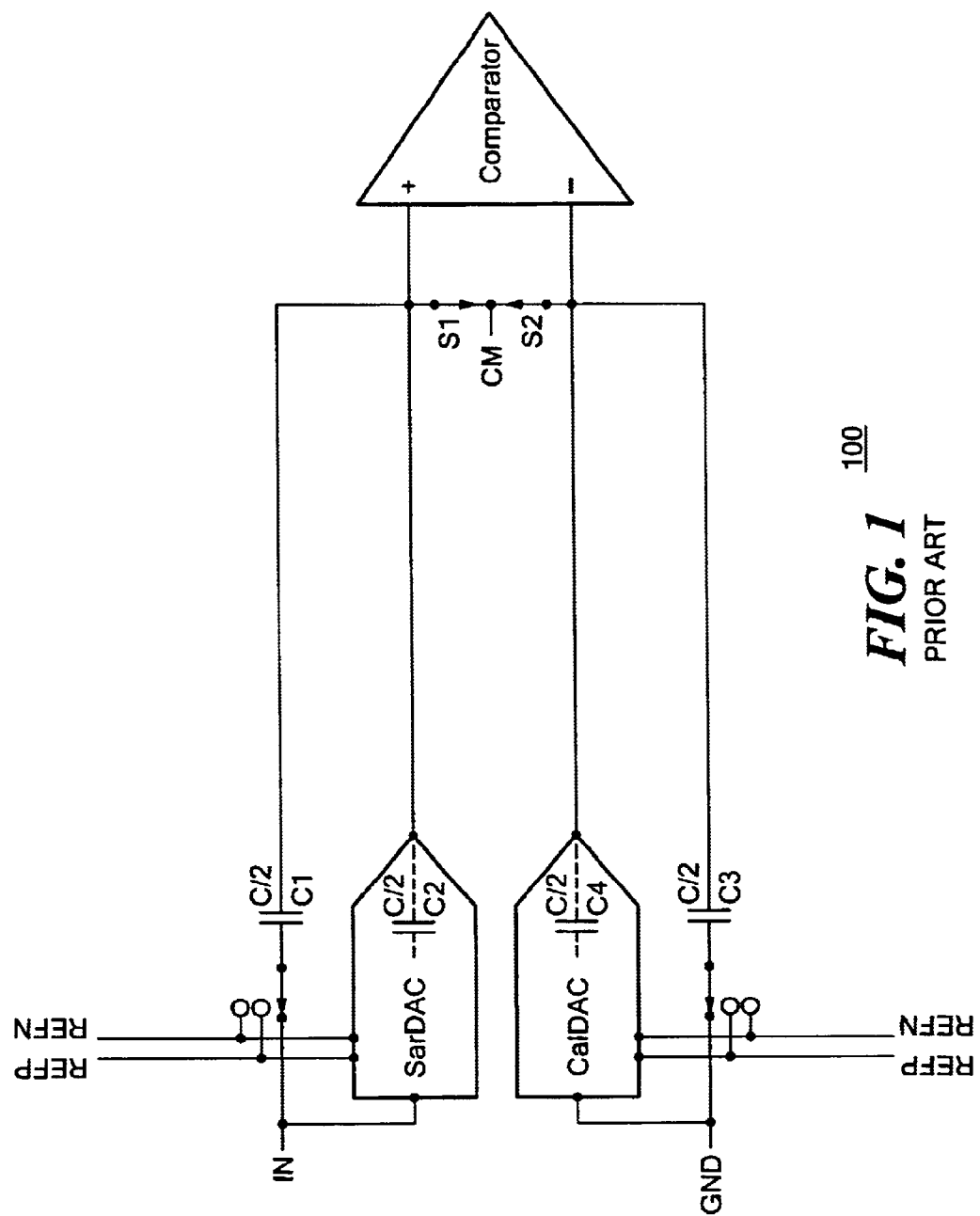
FIG. 1 is a block diagram showing exemplary single channel pseudo-differential ADC logic as known in the art.

FIG. 1 is a block diagram showing exemplary single channel pseudo-differential ADC logic 100 as known in the art. The ADC logic 100 works generally as follows. An analog input signal IN is sampled on the SarDAC (capacitors C1 and C2) with an equivalent capacitance C. At the same time, the input ground reference GND is sampled on the CalDAC (capacitors C3 and C4). Switches S1 and S2 are then opened, capturing a charge equivalent to the input voltage onto the DACs. The SarDAC is used to binarily determine the equivalent digital representation of the analog input signal, while the CalDAC provides bit-error corrections to the SarDAC.

The architecture of the ADC logic 100 has a number of benefits. First, the input sample-and-hold function is inherent in sampling on the capacitor DACs. Second, the layout symmetry provides a first-order cancellation of charge injection, power supply sensitivity, and temperature drift. Finally, the differential comparator and DAC, combined with the pseudo-differential sampling, provides improved common-mode rejection of substrate, supply, and other noise.

Figure 2:
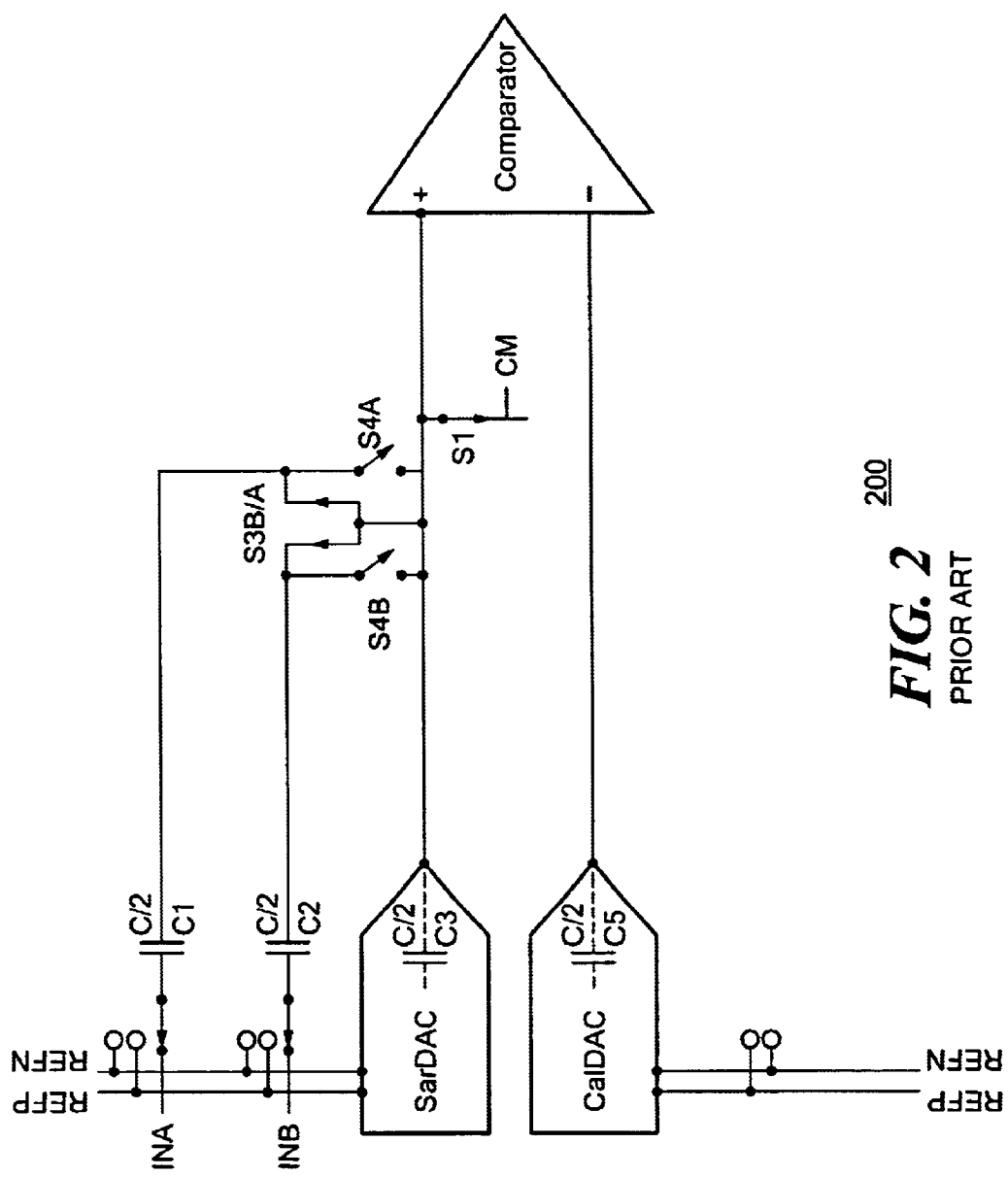
FIG. 2 is a block diagram showing exemplary dual channel simultaneous sampling ADC logic as known in the art.

FIG. 2 is a block diagram showing exemplary dual channel simultaneous sampling ADC logic 200 as known in the art. The ADC logic 200 is a variation of the ADC logic 100 in which an additional capacitor is added for sampling the second input, and a switch is added to feed the two sampled inputs alternately to the comparator. For convenience, the two analog input signals are referred to as analog input signal A (INA) and analog input signal B (INB). With the added capacitor, the inputs are sampled on half the array capacitance (C/2) rather than C, so, to maintain a full-scale charge of (REFP−REFN)*C, the input range of each channel needs to be 2*(REFP−REFN). The switches S4A and S4B are used to connect the inputs to the comparator. Specifically, each analog input signal INA and INB is simultaneously sampled on capacitors C1 and C2 using switches S3A and S3B. Once the input charge has been captured, the sampling switch S1 is opened, and then switch S4A is closed in order to convert analog input signal INA. Once conversion of analog input signal INA is complete, the switch S4A is opened and the switch S1 is closed, thereby resampling the DACs. Once the DACs settle, the switch S1 is opened and the switch S4B is closed in order to convert analog input signal INB.

The architecture of the ADC logic 200 presents a number of problems. Among other things, the ADC logic 200 is no longer pseudo-differential and thus has lost design and layout symmetry, has a non-optimal capacitor layout, and has cross-talk issues. Regarding the capacitor layout, in order to minimize capacitor mismatch errors due to processing limitations, it is common industry practice to ratio unit sized capacitors. Specifically, a capacitor is formed from a number of unit cells that are typically arranged in an array pattern. A certain number of unit cells are connected in order to form a capacitor of a given capacitance (i.e., one cell provides one unit of capacitance, two cells provide twice the capacitance, and so on). Given these unit cells, a common-centroid pattern is often employed to minimize the effect of surface gradients in the capacitor oxide across the entire structure. Another common practice involves surrounding the entire common-centroid array with additional "dummy" capacitors that mimic the geometry of other unit capacitors on all axes of the "main" unit cells. The size of these mismatch errors, combined with the desired calibration resolution, determines the trim and/or calibration circuitry required for the system. The capacitors C1, C2, and C3 must be very accurate, and each is typically laid out in a common-centroid pattern surrounded by "dummy" capacitors. Because the ADC 200 is not symmetric, the use of such capacitors could lead to increased crosstalk from INA to INB and vice-versa. In order to reduce this crosstalk, the capacitor matching or area must be compromised. Also, since switches S3A and S3B sample each input to the same point CM, the AC current through each capacitor can lead to crosstalk during signal acquisition.

An embodiment of the present invention maintains layout symmetry and reduces crosstalk without substantially increasing circuit area. The SarDAC side and the CalDAC side include substantially identical components laid out in a mirror-image fashion. This allows for simultaneous sampling on both channels and maintains layout symmetry. With an input now on each side of the comparator, it becomes necessary to switch the functions of the SarDAC and CalDAC when converting the analog input signal on the CalDAC side. This is preferably accomplished using additional switches, although it can alternatively be accomplished using additional digital logic.

Figure 3:
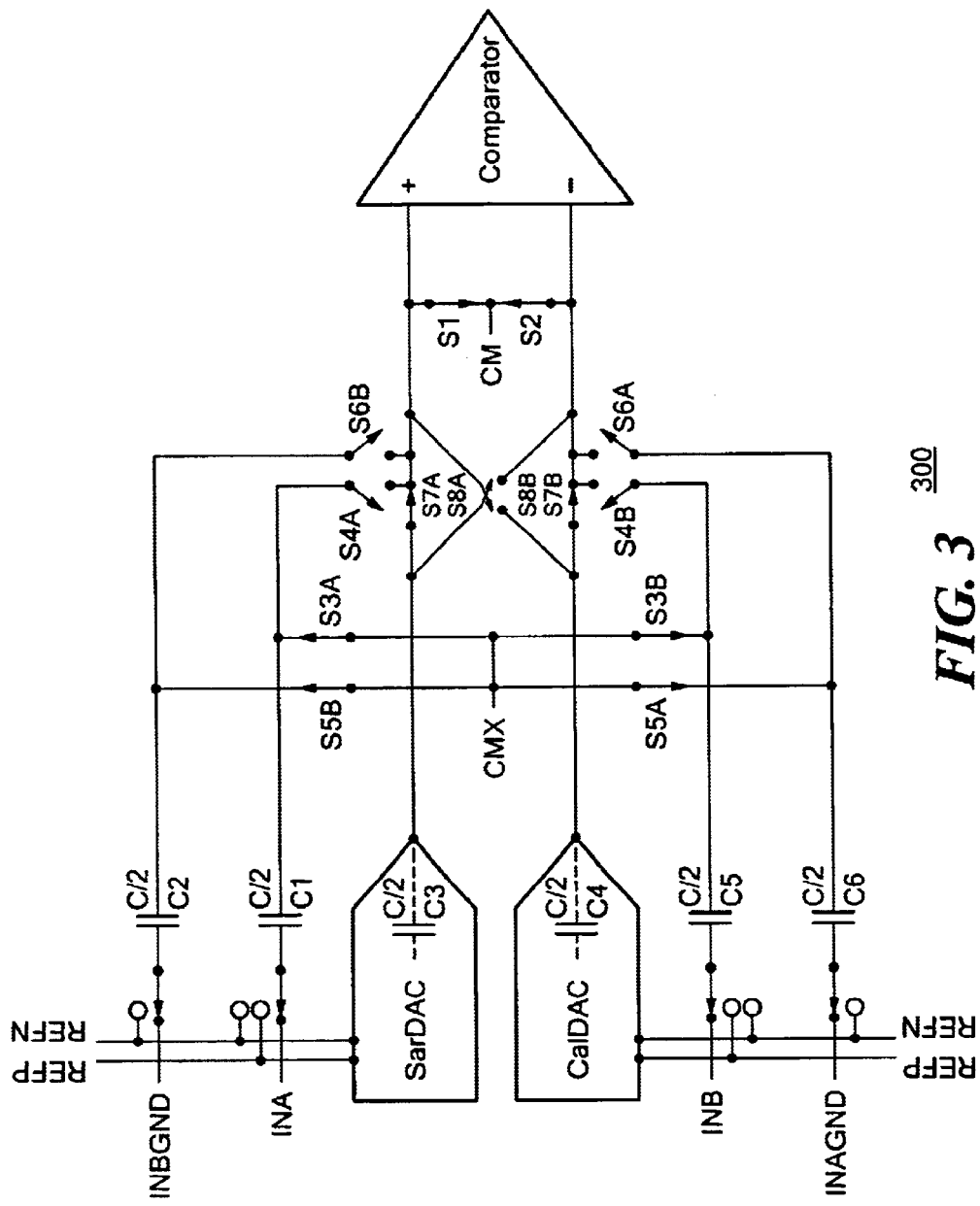
FIG. 3 is a block diagram showing exemplary dual channel ADC logic in accordance with an embodiment of the present invention.

FIG. 3 is a block diagram showing exemplary dual channel ADC logic 300 in accordance with an embodiment of the present invention. The ADC logic 300 can be viewed as a variation of the ADC logic 200 in which an additional capacitor C6 and corresponding sampling switches S5 and comparator connect switches S6 have been added and analog input signal INB has been moved to the CalDAC side. Switches S7 and S8 are used to switch the functions of the SarDAC and CalDAC for alternately converting INA and INB.

As with the ADC logic 200, the ADC logic 300 samples the inputs on half of the array capacitance (C/2). Thus, the ADC full scale signal needs to be 2*Vref in order to maintain signal to noise ratio (SNR) and make the SAR work. This implies that there is an inherent gain error, since each MSB is calibrated to the rest of the DAC in order to minimize the size of the read-only memory (ROM) used for coefficient storage and other things. Since the input swing is 2*Vref (5V nominal), a CMOS input switch is typically used.

In order to minimize capacitor mismatch errors due to processing limitations, it is common industry practice to ratio unit sized capacitors. Specifically, a capacitor is formed from a number of unit cells that are typically arranged in an array pattern. A certain number of unit cells are connected in order to form a capacitor of a given capacitance (i.e., one cell provides one unit of capacitance, two cells provide twice the capacitance, and so on). Given these unit cells, a common-centroid pattern is often employed to minimize the effect of surface gradients in the capacitor oxide across the entire structure. Another common practice involves surrounding the entire common-centroid array with additional "dummy" capacitors that mimic the geometry of other unit capacitors on all axes of the "main" unit cells. The size of these mismatch errors, combined with the desired calibration resolution, determines the trim and/or calibration circuitry required for the system. The capacitors C1 and C5 must be very accurate, and each is typically laid out in a common-centroid pattern surrounded by "dummy" capacitors.

Figure 4:
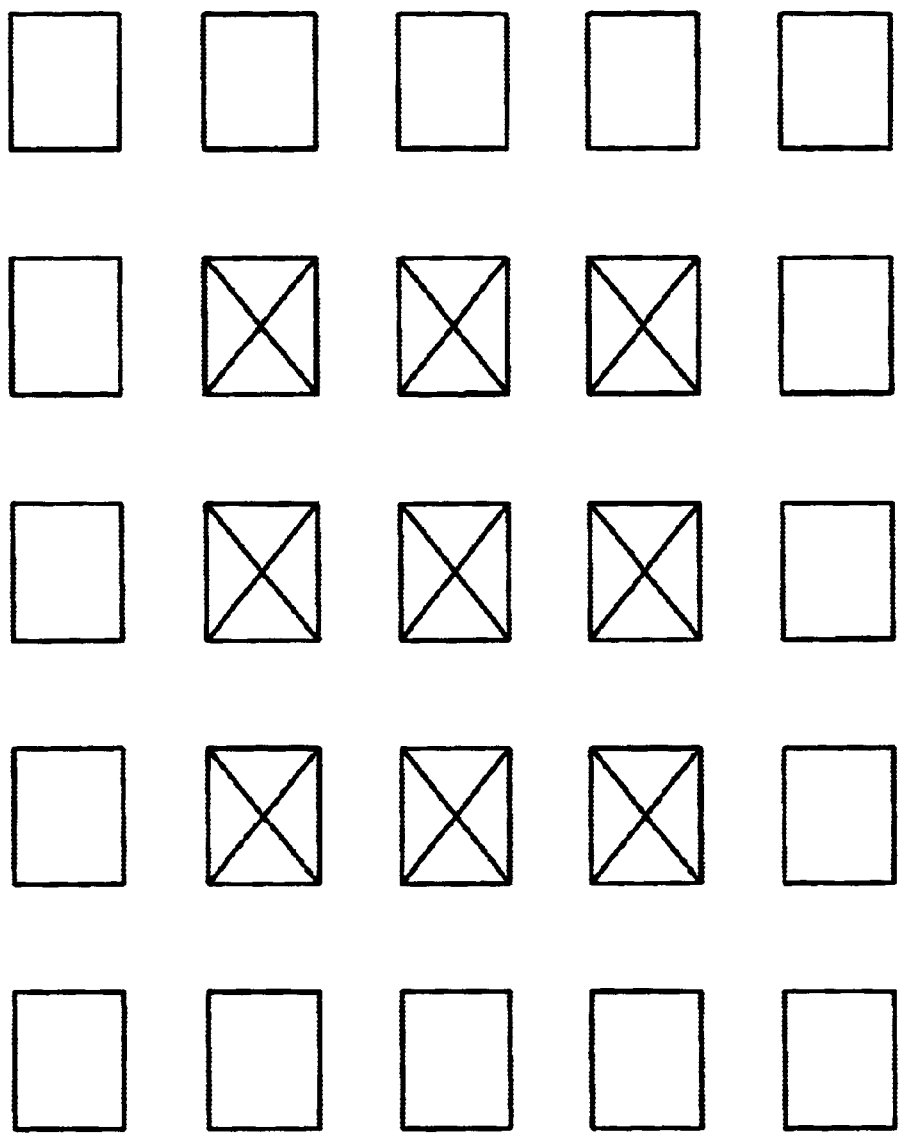
FIG. 4 is a block diagram showing an exemplary capacitor array in accordance with an embodiment of the present invention.

FIG. 4 is a block diagram showing an exemplary capacitor array 400 of the type typically used for capacitors C1 and C5. The capacitor array 400 includes a plurality of capacitor units formed in an array pattern. Some number of interior capacitor units, for example, as marked with an "X" in FIG. 4, are interconnected to form the capacitor. The remaining "dummy" capacitor units are not used for the capacitor.

Unlike capacitors C1 and C5, which need to be very accurate, the matching requirements for the corresponding ground sampling capacitors C2 and C6 are relatively unimportant. The capacitors C2 and C6 are used for pseudo-differential sampling as well as charge injection cancellers. They do not contribute to the linearity, but do cause a change in the attenuation of the CalDAC. Therefore, the capacitors C2 and C6 can be less accurate than the capacitors C1 and C5 (e.g., 8-bit accuracy for the capacitors C2 and C6 versus 16-bit accuracy for the capacitors C1 and C5).

With the capacitor C2 located on the SarDAC side and the capacitor C6 located on the CalDAC side, the capacitors C2 and C6 are preferably formed from the "dummy" capacitor units of the capacitor arrays for the capacitors C1 and C5, respectively. Thus, from a device size perspective, the capacitors C2 and C6 are essentially free, and the circuit area used for capacitors is essentially the same as that for the ADC logic 100.

With an input on each side of the comparator, the functions of the SarDAC and CalDAC alternate when converting the analog input signal INA and the analog input signal INB. In the ADC logic 300, this is accomplished using switches S7 and S8.

In order to convert analog input signal INA, the capacitor C1 and the SarDAC are fed to the "+" input of the comparator, while capacitor C6 and the CalDAC are fed to the "−" input of the comparator. Thus, switches S7 are closed, switches S8 are opened, switch S4A is closed, switch S4B is opened, switch S6A is closed, and switch S6B is opened.

In order to convert analog input signal INB, the capacitor C5 and the SarDAC are fed to the "−" input of the comparator, while the capacitor C2 and the CalDAC are fed to the "+" input of the comparator. Thus, switches S7 are opened, switches S8 are closed, switch S4A is opened, switch S4B is closed, switch S6A is opened, and switch S6B is closed. In this configuration, the sense of the comparator is inverted with respect to analog input signal INA such that the comparator output for analog input signal INB must be inverted.

It should be noted that the use of switches S7 and S8 increases the top plate switch complexity, but minimizes the changes required to the digital SAR and calibration circuitry.

The ADC logic 300 requires associated control logic to control the position and timing of the various switches. Among other things, the control logic controls the position and timing of switches S1, S2, S3, and S5 for sampling the input signals and control the position and timing of switches S4, S6, S7, and S8 for feeding the appropriate signals to the comparator.

Figure 5:
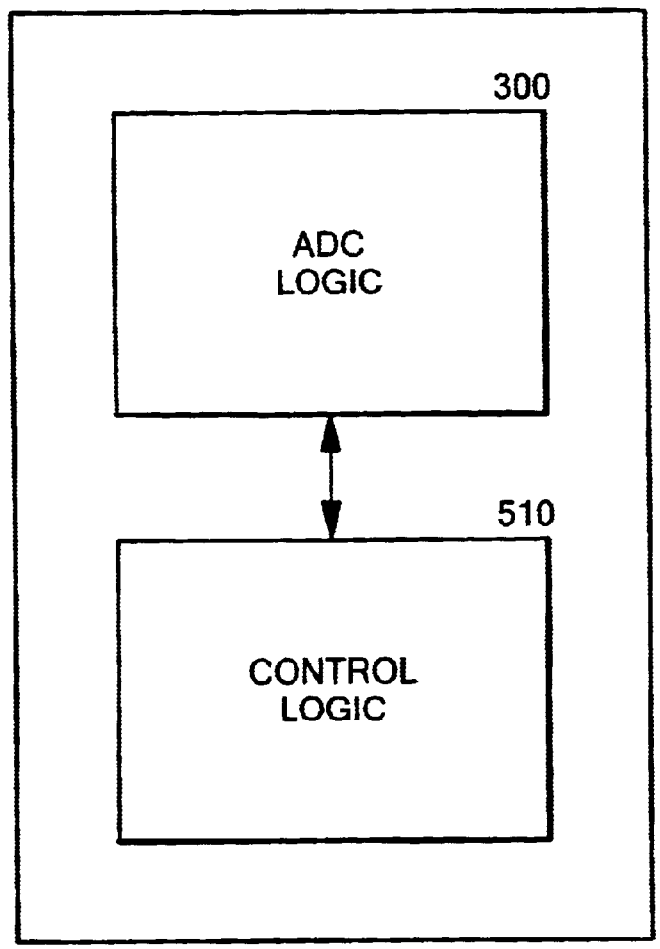
FIG. 5 is a block diagram showing an exemplary ADC including ADC logic and associated control logic in accordance with an embodiment of the present invention.

FIG. 5 is a block diagram showing an exemplary ADC 500 including the ADC logic 300 and associated control logic 510. Among other things, the control logic 510 controls the position and timing of switches S1, S2, S3, and S5 for sampling the input signals and control the position and timing of switches S4, S6, S7, and S8 for feeding the appropriate signals to the comparator.

Figure 6:
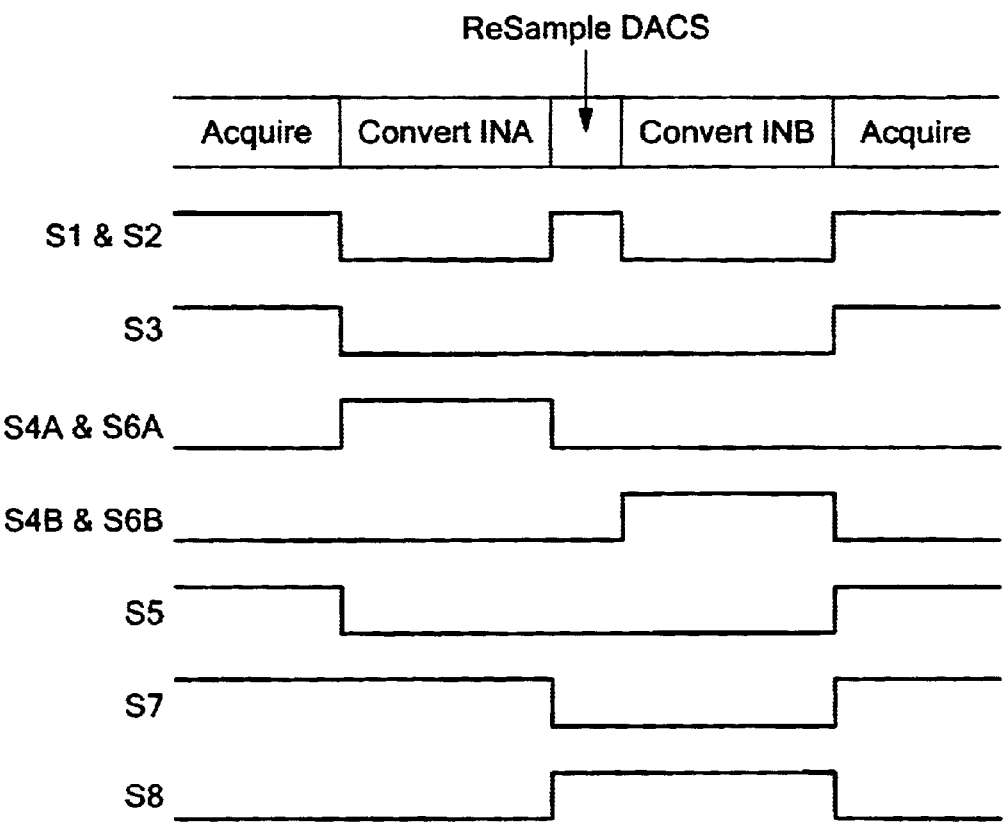
FIG. 6 is a timing diagram showing the relative position and timing of the various switches, as controlled by the control logic, in accordance with an embodiment of the present invention.

FIG. 6 is a timing diagram 600 showing the relative position and timing of the various switches, as controlled by the control logic 510. The control logic 510 controls the ADC logic 300 to repetitively acquire INA and INB, convert INA, resample the DACs, and convert INB.

Prior to acquiring INA and INB, the control logic 510 typically initializes each switch to a default position. In this example, the control logic 510 typically initializes switches S1, S2, S3, S4A, S5, S6A, and S7 to a closed position and initializes switches S4B, S6B, and S8 to an open position.

After initializing the switches, the control logic 510 causes INA and INB to be acquired by closing switches S1, S2, S3, and S5 and opening switches S4B and S6B for a predetermined acquisition time. The control logic also opens switches S8 and closes switches S7 in preparation for conversion of INA.

When acquisition is complete, the control logic 510 causes INA to be converted by opening switches S, S2, S3, and S5 and closing switches S4A and S6A for a predetermined conversion time.

When INA conversion is complete, the control logic 510 causes the DACs to be resampled by closing switches S1 and S2 and opening switches S4A and S6A for a predetermined resampling time. The control logic 510 also opens switches S7 and closes switches S8 in preparation for conversion of INB.

When resampling is complete, the control logic 510 causes INB to be converted by opening switches S1 and S2 and closing switches S4B and S6B for a predetermined conversion time.

When INB conversion is complete, the control logic 510 causes INA and INB to be reacquired by opening switches S4B and S6B and closing switches S1, S2, S3, and S5. The control logic 510 also opens switches S8 and closes switches S7 in order to prepare for the next conversion of INA.

In the ADC logic 300, the capacitors C1/C2 and C5/C6 are sampled to a common voltage at point CMX. This can lead to increased crosstalk between the inputs due to the finite routing and bonding impedances within the package. This crosstalk can be reduced by sampling capacitors C1/C2 and C5/C6 to separate common mode voltages.

It should be noted that the described ADC logic can be modified to support fully-differential analog inputs. The ADC logic will operate in a fully-differential mode on channel A by changing INA and INAGND to INA+ and INA−, respectively, and will operate in a fully-differential mode on channel B by changing INB and INBGND to INB+ and INB−, respectively.

Figure 7:
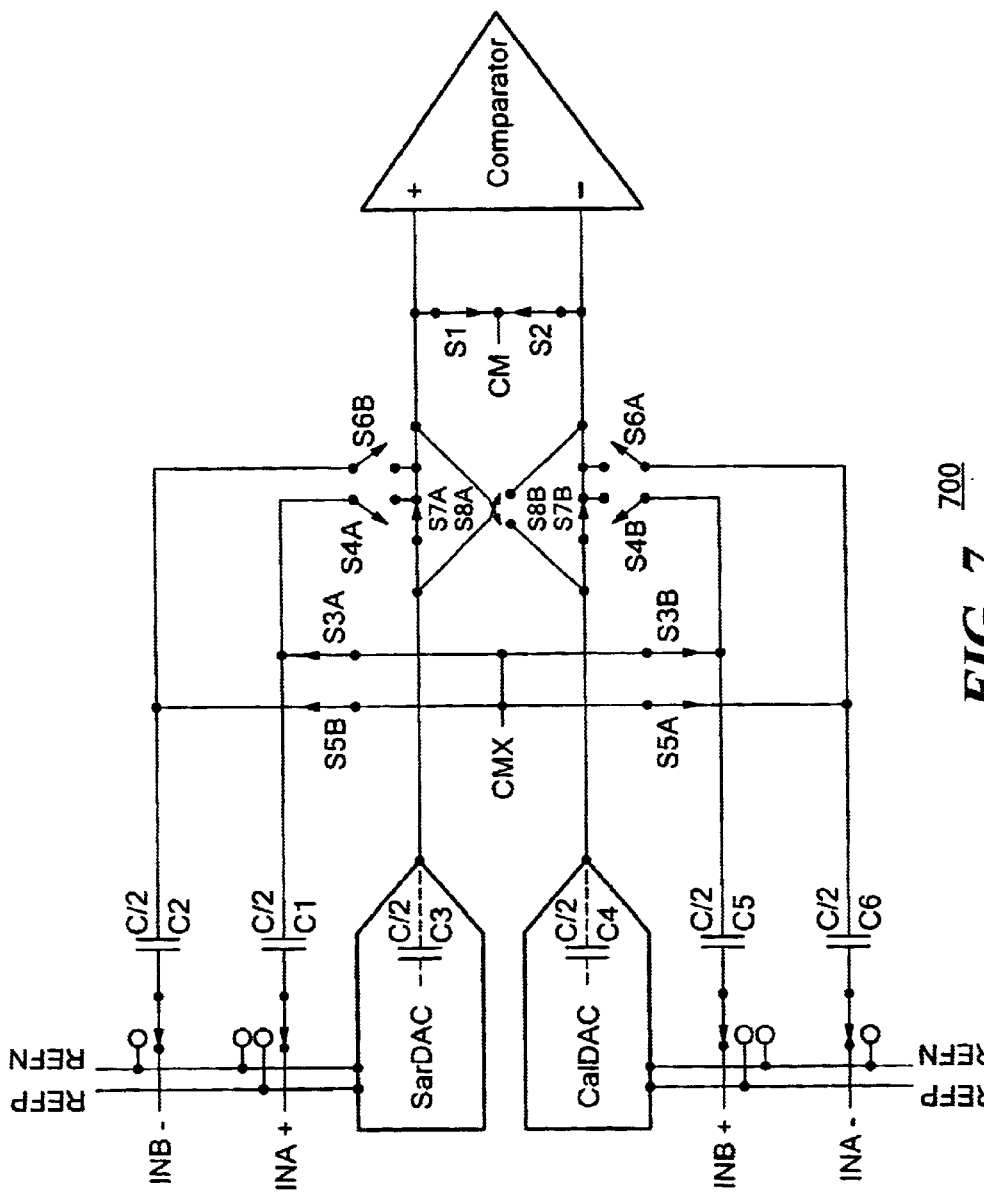
FIG. 7 is a block diagram showing exemplary ADC logic supporting fully-differential operation on both channels in accordance with an embodiment of the present invention.

FIG. 7 is a block diagram showing exemplary ADC logic 700 supporting fully-differential operation on both channels. Specifically, INA and INAGND have been changed to INA+ and INA−, respectively, and INB and INBGND have been changed to INB+ and INB−, respectively.

In a fully-differential mode of operation, both INA+ and INB− are connected through the various switches to the "+" input of the comparator for converting analog input signal A, while both INB+ and INA− are connected through the various switches to the "−" input of the comparator for converting analog input signal B. Unlike the pseudo-differential mode of operation, though, the fully-differential mode of operation outputs a digital value that is indicative of the difference between the "+" and "−" components of a signal rather than a digital value that is indicative of one signal or the other with respect to ground.

It should be noted that the described ADC logic can be modified to support single-ended analog inputs (as opposed to pseudo-differential or fully-differential inputs).

Specifically, the ADC logic will operate in a single-ended mode by omitting capacitors C2 and C6 and switches S5 and S6. When converting channel A, the capacitor C1 and the SarDAC are connected to the "+" input of the comparator while the CalDAC is connected to the "−" input of the comparator. When converting channel B, the capacitor C5 and the SarDAC are connected to the "−" input of the comparator while the CalDAC is connected to the "+" input of the comparator.

Figure 8:
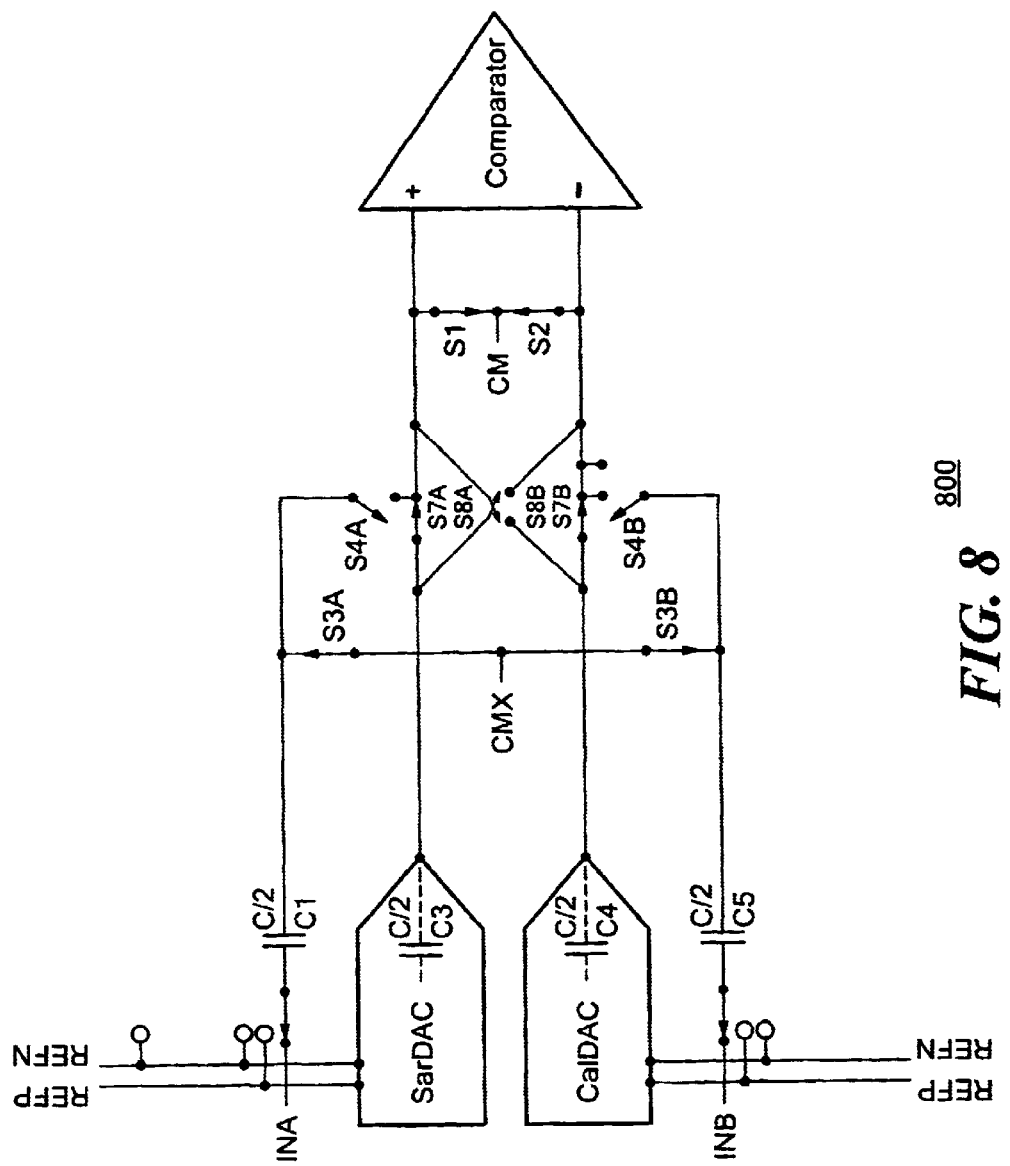
FIG. 8 is a block diagram showing exemplary ADC logic supporting single-ended analog inputs in accordance with an embodiment of the present invention.

FIG. 8 is a block diagram showing exemplary ADC logic 800 supporting single-ended analog inputs. Specifically, capacitors C2 and C6 and switches S5 and S6 have been omitted. When converting channel A, the capacitor C1 and the SarDAC are connected to the "+" input of the comparator while the CalDAC is connected to the "−" input of the comparator. When converting channel B, the capacitor C5 and the SarDAC are connected to the "−" input of the comparator while the CalDAC is connected to the "+" input of the comparator.

In the embodiments described above, a cross-connect switch formed by switches S7 and S8 is used to switch the functions of the SarDAC and the CalDAC to alternately convert samples from the two channels. In an alternate embodiment of the present inention, the cross-connect switch is eliminated, and the functions of the two DACs are switched digitally. Specifically, one DAC is connected to the "+" input of the comparator and the other DAC is connected to the "−" input of the comparator. In order to convert INA, the first DAC is digitally configured to act as the SarDAC and the second DAC is digitally configured to act as the CalDAC. In order to convert INB, the second DAC is digitally configured to act as the SarDAC and the first DAC is digitally configured to act as the CalDAC. Such an embodiment requires that both DACs be fully calibrated to the required accuracy of the ADC.

Figure 9:
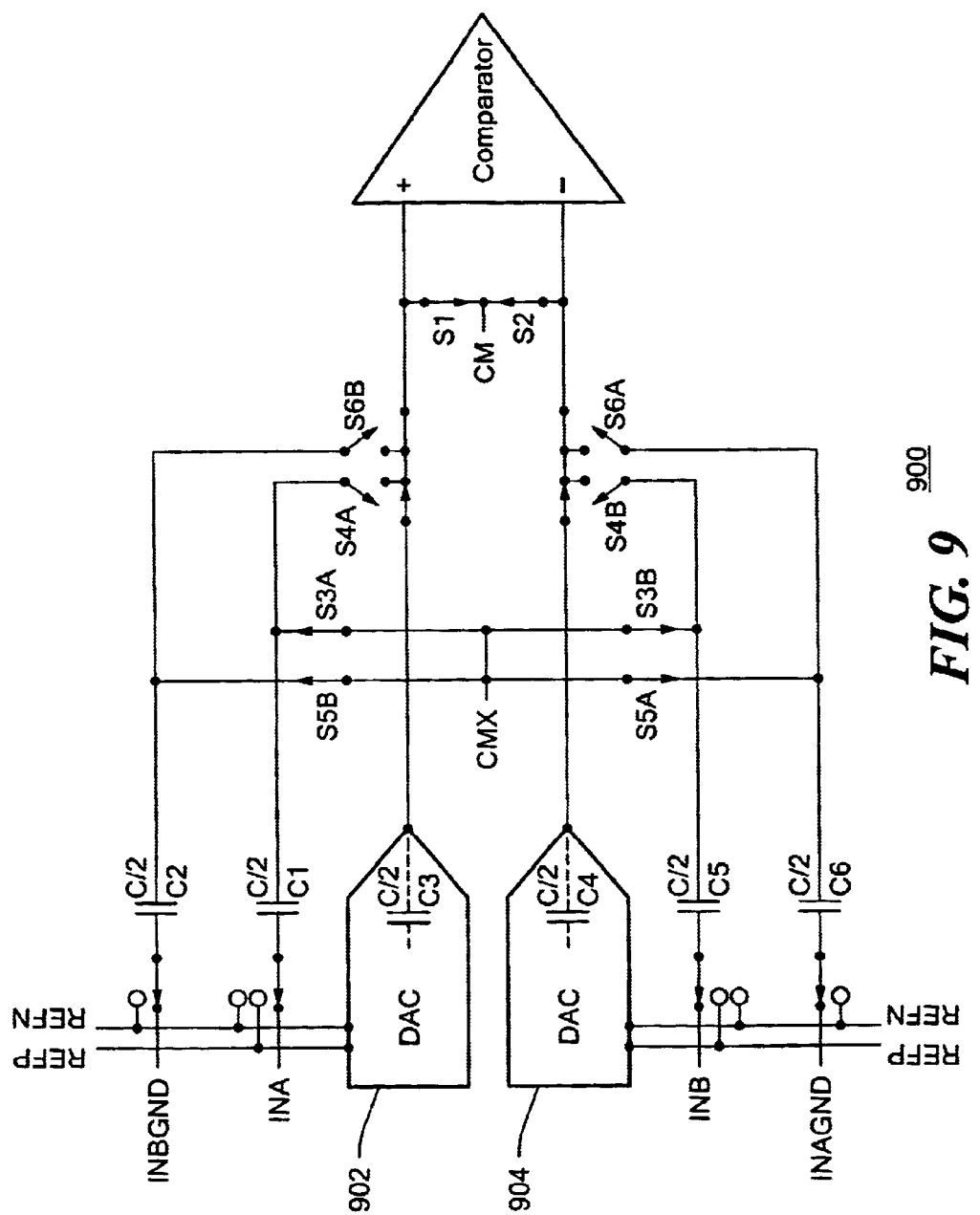
FIG. 9 shows an exemplary ADC in which the functions of the DACs are switched digitally without the use of a cross-connect switch in accordance with an embodiment of the present invention.

FIG. 9 shows an exemplary ADC 900 in which the functions of the DACs are switched digitally without the use of a cross-connect switch. The ADC 900 includes two DACs, specifically DAC 902 and DAC 904. The DAC 902 is coupled to the "+" input of the comparator, and the DAC 904 is coupled to the "−" input of the comparator. Both DACs are fully calibrated to the required accuracy of the ADC. In order to convert INA, the DAC 902 is digitally configured to act as the SarDAC and the DAC 904 is digitally configured to act as the CalDAC. In order to convert INB, the DAC 904 is digitally configured to act as the SarDAC and the DAC 902 is digitally configured to act as the CalDAC.

It should be noted that bottom plates of the sampling capacitors are typically tied to the input during sampling and are separated from the inputs and tied to a fixed reference voltage when sampling is complete.

It should be noted that the present invention is in no way limited to the order in which the input signals are converted. In the embodiments described above, analog input signal A is converted before analog input signal B in each sampling/conversion cycle. In various alternative embodiments, however, analog input signal B can be converted before analog input signal A in each sampling/conversion cycle by controlling the various switches to convert analog input signal B and then analog input signal A in each sampling/conversion cycle.

It should be noted that the present invention is in no way limited to simultaneous sampling of the two input signals. Although the ADC architecture described above supports simultaneous sampling of both input samples, the ADC architecture also supports pipelining wherein, for example, analog input signal B is sampled while analog input signal A is being converted and analog input signal A is sampled while analog input signal B is converted. In various alternative embodiments, then, the various switches can be controlled so that analog input signal B is sampled while analog input signal A is being converted and analog input signal A is sampled while analog input signal B is converted.

The present invention may be embodied in other specific forms without departing from the true scope of the invention. The described embodiments are to be considered in all respects only as illustrative and not restrictive.

What is claimed is:

1. A dual channel analog to digital converter comprising:
   a first sampling capacitor for sampling a first analog input signal;
   a second sampling capacitor for sampling a second analog input signal;
   a comparator having a first comparator input and a second comparator input;
   input sampling logic operably coupled to cause the first sampling capacitor to sample the first analog input signal and to cause the second sampling capacitor to sample the second analog input signal; and
   conversion logic operably coupled to connect the first sampling capacitor to the first comparator input and disconnect the second sampling capacitor from the second comparator input for converting a first analog input signal sample and to connect the second sampling capacitor to the second comparator input and disconnect the first sampling capacitor from the first comparator input for converting a second analog input signal sample.

2. The dual channel analog to digital converter of claim 1, further comprising a first digital to analog converter for successive approximation of the first analog input signal and the second analog input signal, wherein the conversion logic is operably coupled to connect the first digital to analog converter to the first comparator input for converting the first analog input signal sample and to connect the first digital to analog converter to the second comparator input for converting the second analog input signal sample.

3. The dual channel analog to digital converter of claim 2, further comprising a second digital to analog converter, wherein the conversion logic is operably coupled to connect the second digital to analog converter to the second comparator input for converting the first analog input signal sample and to connect the second digital to analog converter to the first comparator input for converting the second analog input signal sample.

4. The dual channel analog to digital converter of claim 3, wherein the conversion logic comprises:
   a cross-connect switch operably coupled to connect the first digital to analog converter to the first comparator input and the second digital to analog converter to the second comparator input for converting the first analog input signal sample and to connect the first digital to analog converter to the second comparator input and the second digital to analog converter to the first comparator input for converting the second analog input signal sample.

5. The dual channel analog to digital converter of claim 4, wherein the cross-connect switch comprises:
   a switch having a first position connecting the first digital to analog converter to the first comparator input for converting the first analog input signal sample and a second position disconnecting the first digital to analog converter from the first comparator input;

a switch having a first position connecting the second digital to analog converter to the second comparator input for converting the first analog input signal sample and a second position disconnecting the second digital to analog converter from the second comparator input;

a switch having a first position connecting the first digital to analog converter to the second comparator input for converting the second analog input signal sample and a second position disconnecting the first digital to analog converter from the second comparator input; and a switch having a first position connecting the second digital to analog converter to the first comparator input for converting the second analog input signal sample and a second position disconnecting the second digital to analog converter from the first comparator input.

6. The dual channel analog to digital converter of claim 1, wherein the input sampling logic comprises:

a first sampling switch operably coupled to selectively connect the first sampling capacitor to a first reference voltage for sampling the first analog input signal; and a second sampling switch operably coupled to selectively connect the second sampling capacitor to a second reference voltage for sampling the second analog input signal.

7. The dual channel analog to digital converter of claim 1, wherein the conversion logic comprises:

a switch having a first position connecting the first sampling capacitor to the first comparator input for converting the first analog input signal sample and a second position disconnecting the first sampling capacitor from the first comparator input; and a switch having a first position connecting the second sampling capacitor to the second comparator input for converting the second analog input signal sample and a second position disconnecting the second sampling capacitor from the second comparator input.

8. The dual channel analog to digital converter of claim 1, further comprising:

a first digital to analog converter coupled to the first comparator input; and a second digital to analog converter coupled to the second comparator input, wherein the conversion logic is operably coupled to digitally configure the first digital to analog converter for successive approximation and the second digital to analog converter for calibration for converting the first analog input signal sample and to digitally configure the second digital to analog converter for successive approximation and the first digital to analog converter for calibration for converting the second analog input signal sample.

9. The dual channel analog to digital converter of claim 1, further comprising:

a third sampling capacitor for sampling a third analog input signal; and a fourth sampling capacitor for sampling a fourth analog input signal.

10. The dual channel analog to digital converter of claim 9, wherein:

the third analog input signal is a ground reference signal corresponding to the first analog input signal for pseudo-differential sampling and conversion of the first analog input signal; and the fourth analog input signal is a ground reference signal corresponding to the second analog input signal for pseudo-differential sampling and conversion of the second analog input signal.

11. The dual channel analog to digital converter of claim 9, wherein:

the first analog input signal and the third analog input signal are corresponding fully-differential analog input signals; and the second analog input signal and the fourth analog input signal are corresponding fully-differential analog input signals.

12. The dual channel analog to digital converter of claim 9, wherein the input sampling logic further comprises:

a third sampling switch operably coupled to selectively connect the third sampling capacitor to a third reference voltage for sampling the third analog input signal; and a fourth sampling switch operably coupled to selectively connect the fourth sampling capacitor to a fourth reference voltage for sampling the fourth analog input signal.

13. The dual channel analog to digital converter of claim 9, wherein the conversion logic is operably coupled to connect the third sampling capacitor to the second comparator input for converting the first analog input signal sample and to connect the fourth sampling capacitor to the first comparator input for converting the second analog input signal sample.

14. The dual channel analog to digital converter of claim 13, wherein the conversion logic comprises:

a switch having a first position connecting the third sampling capacitor to the second comparator input for converting the first analog input signal sample and a second position disconnecting the third sampling capacitor from the second comparator input; and a switch having a first position connecting the fourth sampling capacitor to the first comparator input for converting the second analog input signal sample and a second position disconnecting the fourth sampling capacitor from the first comparator input.

15. The dual channel analog to digital converter of claim 9, wherein the first sampling capacitor, the second sampling capacitor, the third sampling capacitor, the fourth sampling capacitor, the comparator, the input sampling logic, and the conversion logic are configured in a substantially symmetric layout.

16. The dual channel analog to digital converter of claim 9, wherein:

the first sampling capacitor is formed from a first number of unit capacitors surrounded by a first number of dummy capacitors;

the second sampling capacitor is formed from a second number of unit capacitors surrounded by a second number of dummy capacitors;

the fourth sampling capacitor is formed from the first number of dummy capacitors; and the third sampling capacitor is formed from the second number of dummy capacitors.

17. The dual channel analog to digital converter of claim 9, wherein the input sampling logic is operably coupled to sample the first sampling capacitor and the third sampling capacitor with reference to a first common mode voltage and to sample the second sampling capacitor and the fourth sampling capacitor with reference to a second common mode voltage separate from the first common mode voltage.

18. The dual channel analog to digital converter of claim 1, wherein the input sampling logic is operably coupled to simultaneously sample the first analog input signal and the second analog input signal.

19. The dual channel analog to digital converter of claim 1, wherein the input sampling logic is operably coupled to sample the second analog input signal during conversion of the first analog input signal sample and to sample the first analog input signal during conversion of the second analog input signal sample.

20. The dual channel analog to digital converter of claim 1, wherein the first sampling capacitor, the second sampling capacitor, the comparator, the input sampling logic, and the conversion logic are configured in a substantially symmetric layout.

21. The dual channel analog to digital converter of claim 1, wherein:

the first sampling capacitor is formed from a first number of unit capacitors surrounded by a first number of dummy capacitors; and the second sampling capacitor is formed from a second number of unit capacitors surrounded by a second number of dummy capacitors.

22. The dual channel analog to digital converter of claim 1, wherein the conversion logic is operably coupled to alternately convert the first analog input signal sample and the second analog input signal sample.

23. The dual channel analog to digital converter of claim 1, wherein the input sampling logic is operably coupled to cause simultaneous sampling of the first analog input signal and the second analog input signal.

* * * * *